Jan. 26, 1971 V. E. PORTER 3,559,077
COUNTING CIRCUIT
Filed Aug. 21, 1967
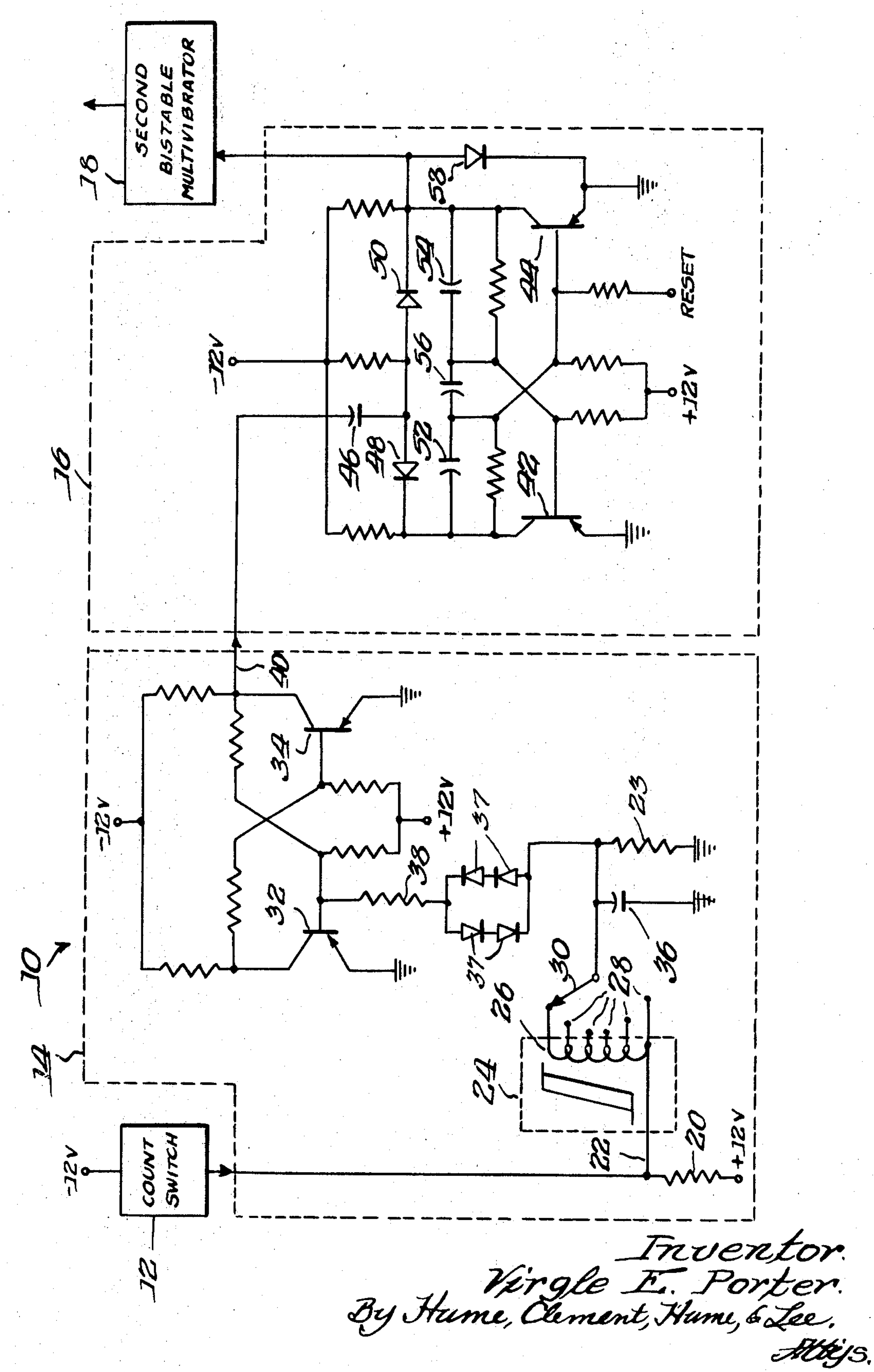
Inventor
Virgle E. Porter
By Hume, Clement, Hume, & Lee,
Attys.

United States Patent Office 3,559,077
Patented Jan. 26, 1971

1 2

3,559,077
COUNTING CIRCUIT

Virgle E. Porter, Country Club Hills, Ill., assignor to Amtron, Inc., Midlothian, Ill., a corporation of Illinois
Filed Aug. 21, 1967, Ser. No. 661,894
Int. Cl. H03k *21/00*
U.S. Cl. 328—39 6 Claims

ABSTRACT OF THE DISCLOSURE

An electronic control circuit highly insensitive to noise including contact bounce, having an input circuit including a saturable magnetic core reactor with a single coil through which the input signal is applied. The input circuit is nonresponsive to input signals of a time duration less than a time duration preselected by a plurality of taps on the coil. Connected to the input circuit are bistable multivibrator circuits with an internal capacitive feedback coupling rendering each multivibrator circuit nonresponsive to triggering by electrical signals of a frequency substantially higher than its operating frequency.

INTRODUCTION

The present invention relates to an electronic circuit for an electronic counter with high noise immunity. It has been the experience of the applicant and others in the field that conventional electronic counters often provide inaccurate counting in industrial locations where high electrical noise levels are present, as for example in locations where large motors are turned on and off. The present invention provides circuitry which is highly immune to noise and may therefore replace mechanical counters in many applications. The present circuitry is particularly effective for eliminating spurious counts due to higher frequency noise spikes or pulses and even noise of great intensity. The present circuitry is also particularly suited for counting the periodic operations of a mechanical switch because it is capable of eliminating false counts due to the contact bounce of the switch. The acceptance of count inputs from switch contacts has traditionally presented problems in counting circuits.

The present invention provides an input circuitry which is responsive only to an electrical input signal having a time duration in excess of a preselected time duration so as to eliminate any response to initial contact bounce or noise. Means are provided for readily changing this preselected time duration. Further, the circuitry preferably connected to the input circuit includes a bistable multivibrator circuit with a capacitive feedback coupling rendering the multivibrator nonresponsive to triggering by electrical signals of a frequency substantially higher than the preselected operating frequency of the multivibrator circuit, thus adding even further noise immunity.

Further objects, features and advantages of the invention pertain to the particular arrangement and structure whereby the above mentioned aspects of the invention are attained. The invention will be better understood by reference to the following description and to the drawing forming a part thereof, wherein:

The figure of the drawing is a schematic circuit diagram of an exemplary embodiment of the invention.

DESCRIPTION OF THE EXEMPLARY EMBODIMENT

Referring to the figure of the drawing, there is shown an electronic control circuit 10 in accordance with the present invention. The control circuit 10 here includes a count switch 12, an input circuit 14, a first bistable multivibrator 16, and a second bistable multivibrator 18. It will be appreciated that the second bistable multivibrator 18 may be connected to a series of further bistable multivibrator circuits as is conventionally practiced in counting circuits.

The count switch 12, which is the input means here, may be a conventional mechanical switch such as for example a single pole-single throw magnetic reed relay switch periodically actuated by the phenomena being counted. By way of example here, minus twelve volts is applied to one side of the count switch and plus twelve volts is applied through a resistor 20 to the other side of the count switch, where an input lead 22 is connected. The input lead 22 into the input circuit 14 will thus have plus twelve volts thereon when the count switch 12 is open or minus twelve volts when the switch is closed.

It may be seen that the input lead 22 is connected into the input circuit 14 through a timing coil 24. The timing coil 24 comprises a saturable magnetic core reactor with a single coil winding 26. The ferromagnetic core may be in the conventional form of a toroid. Preferably the core has a sharply rectangular hysteresis loop characteristic.

During the time period in which the core is being saturated, i.e. switched, by the input signal applied through the winding 26, it will be appreciated that the timing coil 24 exhibits a high inductive impedance. Accordingly, during this time period no appreciable input signal can pass through the timing coil 24 regardless of fluctuations in the input signal such as that due to contact bounce or other noise. Only if an input signal of a given polarity is sustained for a sufficiently long enough period of time to saturate the core can a signal pass through. Once the core is saturated, the timing coil 24 impedance will abruptly decrease to only essentially the D.C. resistance of the winding 26. The time required to saturate the core, i.e. the period of high impedance of the timing coil 24, is inversely proportional to the voltage level applied to the winding 26 and directly proportional to the number of turns of the winding 26. There is a constant multiplier which is a function of the core selected. It may be seen that the time filtering of the input signal occurs on both the opening and closing of the count switch 12.

It may be seen that the winding 26 of the timing coil 24 has a plurality of spaced taps 28. The taps 28 may be selectively connected by a switch 30 or other suitable means to change the number of effective turns in the winding 26 through which the input signal is applied. Switching between the various taps 28 provides a wide range of operating time selections of the timing coil 24. The timing coil 24 is thus in effect a selectable time filter which responds only to input signals having a time duration exceeding a desired time duration selected by the switch 30 or other suitable means. This flexibility allows the selection of the optimum operating condition for a particular environment and counting speed. The taps 28 may be chosen, for example, such that the response time of the timing coil 24 may be doubled for each successive tap 28 position.

As the count switch 12 operates, the signal at the input lead 22 will change in polarity from plus twelve volts to minus twelve volts. At each change, the reversed polarity current will attempt to flow through the winding 26 but will be opposed by a high impedance while the core material is switching. Once the core material is saturated, the input signal will freely pass through the wniding 26 and trigger a flip-flop circuit including transistors 32 and 34. A capacitor 36 is connected between the output of the timing coil 24 and ground to eliminate any noise which might pass through the timing coil 24 by distributed capacitance in the winding 26.

The flip-flop formed by the transistors 32 and 34 is arranged such that when a positive voltage is applied at the lower end of a resistor 38 connected at its upper end to the base of transistor 32, transistor 32 is biased to cut off and transistor 34 is thereby clamped to ground. Correspondingly, a negative voltage appearing at the lower end of resistor 38 switches transistor 32 into saturation and cuts off transistor 34.

The lower end of resistor 38 is connected through diodes and switch 30 to the output or inner end of the winding 26 of the timing coil 24. Assuming that the count switch 12 is open so that plus twelve volts is supplied to the input of the timing coil 24, after the period of time has elapsed sufficient for the core to saturate a positive voltage will be applied to the lower end of the resistor 38 to operate transistor 32 as described above. Conversely, when the count switch 12 is closed a minus twelve volts is applied to the input lead 22, and after an equal time period delay by the timing coil 24 this negative potential is applied to the lower end of resistor 38 which reverses the state of transistors 32 and 34.

It may be seen that there is no need for a separate reset winding on the timing coil 24 and that resetting is accomplished automatically through the single winding 26 by the change in polarity of the input signal with each operation of the count switch 12, thus reducing circuit complexity and cost.

In order to thoroughly understand the mechanism of switching a square loop core, the following two equations must be considered:

Equation No. 1

$$T=\frac{MN\times 10^{-8}}{E}$$

In Equation No. 1:

T=switching time in seconds
M=total flux of the core in maxwells
N=turns of wire
E=volts.

Equation No. 2

$$I_c=\frac{1.257N}{H_cL}$$

In Equation No. 2:

$I_c$=switching current in amperes
N=turns of wire
$H_c$=coercive force in oersteds
L=mean core length in centimeters.

As can be seen in Equation No. 1, the switching time for the core is a fixed quantity for any given tap 28, and it should be noted that it does not involve current.

From Equation No. 2, it can be appreciated that the switching current $I_c$ is independent of voltage applied. Thus while the core is switching the current is substantially constant and very small and the voltage developed across resistor 23 is such that diodes 37 do not conduct. Resistor 23 is used for sampling the current flowing through the windings of timing coil 24. It is selected in such a way that the voltage appearing across resistor 23 is always less than the combined forward diode drops of diodes 37 for the tap 28 which yields the fewest number of turns. Diodes 37 establish a threshold voltage level. For purposes of analysis, it is convenient to assume that the switching curent is constant throughout until saturation. However, in fact, small order departures from an ideal rectangular hysteresis loop cause the $H_c$ to increase as saturation is approached. The exact value for resistor 23 is accordingly picked so that the core is well into saturation before switching occurs. This necessitates a rather substantial current from the count switch or resistor 20 as the case may be. This further enhances the noise immunity.

The output lead 40 from the input circuit 14 is preferably connected to the output of one of the transistors 32 or 34, which provide an output pulse directly responsive to the operating condition of the count switch 12. This output lead 40 is preferably connected into the first bistable multivibrator 16 through a generally conventional triggering input.

The multivibrator 16 is preferably of a generally conventional configuration for an audio frequency multivibrator. The multivibrator 16 here is of the conventional collector steering type with transistors 42 and 44 as the two active switching elements. However, as described herein, the multivibrator 16 contains triggering control means which render it nonresponsive to triggering by electrical input signals of a frequency substantially higher than its operating frequency. The multivibrator 16, unlike a conventional multivibrator, is insensitive to high frequency, i.e. short duration, noise pulses including even those of amplitudes as great as the supply voltages.

The input or triggering signal on the lead 40 is applied through a capacitor 46 to the anodes of both diodes 48 and 50. The cathodes of these diodes are respectively connected to the collectors of the transistors 42 and 44. Initially, one of these transistors is in a cut-off condition so that its collector is at a negative potential with respect to ground whereas the other transistor is near ground potential. When a positive excursion appears on the lead 40 it will pull the collector of whichever transistor is cut off towards ground. This in turn causes the opposite transistor to be cut off through a conventional capacitive cross-coupling network. The capacitor 52 cross-couples the collector of transistor 42 to the base of transistor 44, and the capacitor 54 cross-couples the collector of transistor 44 to the base of transistor 42. The capacitors 52 and 54 preferably have the same value.

In the conventional multivibrator circuit, even an extremely short duration pulse, such as a noise spike appearing at the input, would normally be effective to trigger the multivibrator circuit. However, the multivibrator circuit 16 contains triggering control means which render it nonresponsive to these short duration, i.e. high frequency, input pulses. This triggering control means comprises a capacitive negative feedback circuit effective only at frequencies substantially in excess of the operating frequency of the multivibrator coupling the output of each of the transistors to its own base and defeating the normal operation of the cross-coupling network so as to prevent the operation of the multivibrator circuit. This is accomplished here by a capacitor 56 connected between the capacitors 52 and 54, i.e. connected between the bases of the two transistors 42 and 44. The capacitance of the capacitor 56 is preferably approximately one-fifth that of the cross-coupling capacitor 52 or 54. A suitable exemplary value for the capacitor 56 would be .022 microfarad and that of the capacitors 52 and 54 would be .1 microfarad each.

It will be appreciated that the normal operating frequency or period of the multivibrator 16 is a function primarily of the capacitors 52 and 54. With a capacitor 56 in the above ratio to the capacitors 52 and 54, the circuit is rendered insensitive to trigger pulses of a frequency substantially higher than the operating frequency of the circuit. Thus, great noise immunity is provided because only a sustained duration input pulse will trigger the multivibrator.

A further nonconventional feature of the multivibrator 16 is the addition of a diode 58 between the output of the multivibrator circuit 16 and ground. This diode 58 prevents positive excursions from the succeeding bistable multivibrator 18 from appearing on the collector of transistor 44 and thereby causing possible false operation or damage to that transistor by applying reverse polarity to its collector. These positive excursions are due to a capacitor in the circuit of the multivibrator 18 corresponding to the capacitor 56.

It will be appreciated that to achieve the same advantage of noise insensitivity the second bistable multivibrator 18 preferably comprises a circuit which is essentially the same as that of the multivibrator 16. Any desired number of multivibrator circuits may be connected in series as with conventional counting circuits. Resetting and counting comparison may be provided as with conventional multivibrators.

It will be appreciated that the construction of the control circuit 10 may be accomplished through the use of generally available circuit components except as otherwise described above.

The apparatus described herein is presently considred to be preferred. The circuitry is both simple and noncritical in nature and yet provides very high stability and noise insensitivity. It is contemplated that further variations and modifications within the purview of those skilled in the art can be made herein. The following claims are intended to cover all such variations and modifications as fall within the true spirit and scope of the invention.

What is claimed is:

1. In combination with a switch input means and an output means, an electronic control circuit for eliminating RF noise and switch contact bounce from said switch input means and providing an unambiguous output signal to said output means comprising:

a single winding saturable magnetic core reactor coupled between said switch input means and said output means, said single winding saturable core reactor having a distinctive change in impedance characteristics only in response to an applied input signal from said input means having a predetermined minimum time duration and having a frequency less than a predetermined maximum frequency, said minimum predetermined time duration of said applied signal necessary to change said impedance characteristics of said single winding saturable magnetic core reactor being greater than the time duration of the oscillatory signals caused by said switch contact bounce and said maximum frequency being the signal frequency associated with said RF noise, and said single winding saturable magnetic core reactor providing said output signal to said output means only in response to said change in said impedance characteristics wherein said electronic control circuit eliminates said switch contact bounce and said RF noise and provides said unambiguous output signal to said output means.

2. The control circuit of claim 1 wherein said single winding saturable magnetic core reactor includes means for preselecting said minimum predetermined time duration of said input signal necessary to change said impedance characteristics of said single winding saturable magnetic core reactor.

3. The control circuit of claim 1 wherein said single winding saturable magnetic core reactor includes a plurality of different selectable taps thereon and wherein said taps are adapted to preselect said minimum time duration of said input signal necessary to change said impedance characteristics of said saturable core reactor.

4. The control circuit of claim 2 wherein said output means comprises an electronic counting means for counting said unambiguous output signal and wherein said electronic counting means comprises:

a bistable multivibrator circuit having a preset maximum operating frequency, said maximum operating frequency being less than the frequency associated with RF noise, and triggering control means in said multivibrator circuit including a capacitive feedback coupling rendering said multivibrator circuit non-responsive to triggering by electrical signals of a frequency greater than said maximum operating frequency of said multivibrator circuit thereby making said electronic counting means immune from RF noise.

5. The control circuit of claim 4 wherein said capacitive negative feedback circuit comprises a capacitor connected between the control input of one switching element and the control input of the other switching element.

6. The control circuit of claim 4 wherein the capacitance of said capacitive negative feedback circuit is approximately one-fifth the capacitance of said capacitive cross-coupling.

References Cited

UNITED STATES PATENTS

| | | | |
|---|---|---|---|
| 2,272,998 | 2/1942 | Bjornson | 328—74 |
| 2,690,536 | 9/1954 | Adams | 336—150X |
| 2,782,306 | 2/1957 | Dickinson | 328—206X |
| 2,951,236 | 8/1960 | Covely et al. | 328—196 |
| 3,041,475 | 6/1962 | Fisher | 307—253 |
| 3,212,038 | 10/1965 | Herrick | 336—150 |
| 2,897,380 | 7/1959 | Neitzert | 307—106 |
| 3,315,087 | 4/1967 | Ingenito | 307—88 |

DONALD D. FORRER, Primary Examiner

H. A. DIXON, Assistant Examiner

U.S. Cl. X.R.

307—234, 291, 314; 328—111, 196